(12) United States Patent
Miles et al.

(10) Patent No.: US 7,543,212 B2
(45) Date of Patent: Jun. 2, 2009

(54) LOW-DENSITY PARITY-CHECK (LDPC) ENCODER

(75) Inventors: Lowell Miles, Albuquerque, NM (US); Sterling Whitaker, Albuquerque, NM (US)

(73) Assignee: Idaho Research Foundation, Inc.

( * ) Notice: Subject to any disclaimer, the term of this patent is extended or adjusted under 35 U.S.C. 154(b) by 186 days.

(21) Appl. No.: 11/226,712

(22) Filed: Sep. 13, 2005

(65) Prior Publication Data

US 2009/0089642 A1    Apr. 2, 2009

Related U.S. Application Data

(60) Provisional application No. 60/609,644, filed on Sep. 13, 2004.

(51) Int. Cl.
*H03M 13/00* (2006.01)

(52) U.S. Cl. .................. 714/752; 704/500; 704/229

(58) Field of Classification Search ............. 714/752
See application file for complete search history.

(56) References Cited

U.S. PATENT DOCUMENTS

| | | | | | |
|---|---|---|---|---|---|
| 4,454,589 | A | * | 6/1984 | Miller ...................... | 708/233 |
| 4,783,778 | A | * | 11/1988 | Finch et al. .............. | 370/419 |
| 4,787,057 | A | * | 11/1988 | Hammond ................ | 708/607 |
| 4,888,774 | A | * | 12/1989 | Kosuge et al. ........... | 714/761 |
| 5,278,781 | A | * | 1/1994 | Aono et al. .............. | 708/523 |
| 5,398,322 | A | * | 3/1995 | Marwood ................ | 711/217 |
| 5,673,407 | A | * | 9/1997 | Poland et al. ............ | 712/222 |
| 5,867,414 | A | * | 2/1999 | Kao ........................ | 708/607 |
| 5,937,016 | A | | 8/1999 | Choi ....................... | 375/341 |
| 6,145,111 | A | | 11/2000 | Crozier et al. ........... | 714/755 |
| 6,262,597 | B1 | | 7/2001 | Bauer et al. ............. | 326/41 |
| 6,526,531 | B1 | | 2/2003 | Wang ...................... | 714/704 |
| 6,556,045 | B2 | | 4/2003 | Cohen ..................... | 326/46 |
| 6,597,745 | B1 | * | 7/2003 | Dowling ................. | 375/296 |
| 6,725,411 | B1 | * | 4/2004 | Gerlach et al. .......... | 714/755 |
| 6,757,122 | B1 | * | 6/2004 | Kuznetsov et al. ...... | 360/53 |
| 6,826,778 | B2 | * | 11/2004 | Bopardikar et al. ...... | 725/145 |
| 6,895,547 | B2 | * | 5/2005 | Eleftheriou et al. ..... | 714/801 |
| 6,928,602 | B2 | * | 8/2005 | Yamagishi et al. ...... | 714/781 |
| 7,069,492 | B2 | * | 6/2006 | Piret ....................... | 714/762 |
| 7,111,221 | B2 | * | 9/2006 | Birru et al. .............. | 714/755 |
| 7,127,653 | B1 | * | 10/2006 | Gorshe .................... | 714/746 |
| 7,162,684 | B2 | * | 1/2007 | Hocevar .................. | 714/800 |

* cited by examiner

*Primary Examiner*—Esaw T Abraham
*Assistant Examiner*—Enam Ahmed
(74) *Attorney, Agent, or Firm*—Haverstock & Owens LLP

(57) ABSTRACT

The encoder chip of the present invention uses LDPC codes to encode input message data at a transmitting end, thereby generating a series of codewords. The encoder chip implements two low-density parity-check (LDPC) codes. The first LDPC code is a (4088,3360) code (4K) which is shortened from a (4095,3367) cyclic code. The second LDPC code is a quasi-cyclic (8158,7136) code (8K). The message data and the generated codewords are transmitted to a receiving end where the received codewords are decoded and checked for errors. To generate the codewords, the encoder applies a generator matrix G to the input message data. The G matrix is generated by first defining an H matrix. An H matrix is initially defined as 16×2 array of right-circulant sub-matrices. The G matrix is formed by manipulating the H matrix according to a 4-step algorithm. A randomizer and a synchronization marker are also included within the encoder.

38 Claims, 3 Drawing Sheets

LOW-DENSITY PARITY-CHECK (LDPC) ENCODER

RELATED APPLICATIONS

This application claims priority of U.S. provisional application Ser. No. 60/609,644, filed Sep. 13, 2004, and entitled "A Radiation Tolerant, 2 Gb/s (8158,7136) Low-Density Parity-Check Encoder", by the same inventors. This application incorporates U.S. provisional application Ser. No. 60/609,644 in its entirety by reference.

FIELD OF THE INVENTION

The present invention relates to a method of and an apparatus for signal encoding and error correction. In particular, the present invention relates to a method of and apparatus for encoding using low-density parity-check code.

BACKGROUND OF THE INVENTION

A problem that is common to all data communications technologies is the corruption of data. The likelihood of error in data communications must be considered in developing a communications technology. Techniques for detecting and correcting errors in the communicated data must be incorporated for the communications technology to be useful. Error correcting codes are employed on data transmission and data storage channels to correct or avoid bit errors due to noise and other channel imperfections. As applied to information theory and coding, an error-correcting code is a code in which each data signal conforms to specific rules of construction so that departures from this construction in the received signal can generally be automatically detected and corrected. Error correcting codes are used to detect and/or correct single-bit errors, double-bit errors, and multi-bit errors.

In information theory, the Shannon-Hartley theorem states the maximum amount of error-free digital data that can be transmitted over a communication link with a specified bandwidth in the presence of noise interference. The Shannon limit of a communications channel is the theoretical maximum information transfer rate of the channel.

The Shannon-Hartley theorem describes the maximum possible efficiency of error-correcting methods versus levels of noise interference and data corruption. This theorem does not describe how to construct the error-correcting method. Instead, the theorem indicates the maximum efficiency of the error-correcting method used.

Two main classes of error-correcting codes are block codes and convolutional codes. Convolutional codes operate on serial data, one or a few bits at a time. Block codes operate on relatively large (typically, up to a couple of hundred bytes) message blocks. There are a number of conventional convolutional and block codes currently in use, and a number of algorithms for decoding the received coded information sequences to recover the original data.

Error correction, using an error correcting code, improves the reliability of communication systems and devices. In conventional encoding methods, an encoder at the transmission end of a communication encodes an input word, such as a block or vector of a given length, to produce a codeword associated with the error correction code. A conventional transmitter stores in its memory one or a small number of algorithms to produce codewords of a certain code. At the receiving end of the communication, a decoder decodes the received codeword to generate an estimation of the original input word.

A channel code is a set of codewords (e.g., binary vectors) which are easily distinguishable from one another, even in the presence of noise, so that transmission errors are avoided. To facilitate encoding and decoding, binary linear codes are generally used. This means that the set of codewords C is a certain k-dimensional subspace of the vector space $F^n_2$ of binary n-tuples over the binary field $F_2 = \{0, 1\}$. Thus, there is a basis $B = \{g_0, \ldots, g_{k-1}\}$ which spans C so that each c∈C may be written as $c = u_0 g_0 + u_1 g_1 + \ldots + u_{k-1} g_{k-1}$ for some $\{u_i\}$ in $F_2$. More compactly, $c = uG$ where $u = \{u_0, u_1, \ldots, u_{k-1}\}$ is the k-bit information word and G is the k×n generator matrix whose rows are the vectors $\{g_i\}$ (as is conventional in coding, all vectors are row vectors). Further, the (n-k) dimensional null space $C^\perp$ of G is spanned by the basis $B^\perp = \{h_0, h_1, \ldots, h_{n-k-1}\}$. Thus, for each c∈C, $cH^T = 0$, where H is the (n-k)×n parity-check matrix whose rows are the vectors $\{h_i\}$. The parity-check matrix H performs m=n-k separate parity checks on a received word.

A low-density parity-check code (LDPC) is a linear block code for which the parity-check matrix H has a low density of 1's. The sparseness of an LDPC code's H matrix makes it amenable to a near-optimal decoding procedure called belief propagation. Using Low Density Parity Check (LDPC) codes for error correction generates parity check codes that have a predetermined number of elements having a value of one in rows and columns of the parity check codes. Parity data is then generated based on the parity check codes. That is, in the coding method based on the LDPC codes, a parity check matrix H having a predetermined number of elements that include a value of one in its rows and columns is formed, and a codeword x satisfying the equation Hx=0 is obtained. The codeword x includes original data and parity data.

There are several known techniques for generating the generator matrix G. These include Hamming codes, BCH codes, and Reed-Solomon codes. Another known code is a low density parity check (LDPC) code, developed by Gallager in the early 1960's. With block codes, a parity check matrix H of size (n-1)×n exists such that the transpose of H (e.g., $H^T$), when multiplied by G, produces a null set, or $G \times H^T = 0$. The decoder multiplies the received codeword c (m×G=c) by the transpose of H, e.g., $c \times H^T$. The result, often referred to as the "syndrome," is a 1×(n-k) matrix of all 0's if c is a valid codeword.

Virtually all LDPC code design procedures involve specification of the H matrix after which an encoding procedure is devised. A generator matrix G may be obtained from H via Gauss-Jordan elimination, but the resulting encoding operation via c=uG is still too complex for long codes. To simplify the operation, a technique has been proposed in which encoding is performed directly from H. Alternatively, cyclic and quasi-cyclic (QC) LDPC codes have been proposed which lend themselves to lower-complexity shift-register based encoder implementations. The low-complexity advantage derives from the fact that the H matrix is composed of circulant submatrices. What is needed is a simpler method of utilizing LDPC codes in encoding procedures. What is also needed is a simpler method of generating a G matrix to be used in such encoding procedures.

SUMMARY OF THE INVENTION

The encoder chip of the present invention uses LDPC codes to encode input message data at a transmitting end, thereby generating a series of codewords. The message data and the generated codewords are then transmitted to a receiving end. At the receiving end, the received codewords are decoded and checked for errors. To generate the codewords, the encoder applies a generator matrix G to the input message data. Therefore, the generator matrix G is needed to implement the encoder. As described above, the G matrix is obtained from an H matrix via Gauss-Jordan elimination. As such, the first step in generating a G matrix is to define an H matrix. An H matrix is initially defined as a plurality of circulant sub-matrices. The H matrix is a 16×2 configuration, and each of the sub-matrices is a circulant matrix. In general, the H matrix is an arbitrarily defined matrix.

The G matrix is formed by manipulating the H matrix according to a 4-step algorithm. First, the H matrix is re-configured by shifting each column two columns to the right. Second, the H matrix from step 1 is forced to upper triangular form. Third, a determined row from the H matrix in step 2 is made circular. Fourth, a parity matrix P is determined from the H matrix in step 3, where the G matrix defined by G=[I:P].

The encoder chip includes input registers, a parity encoder, and a data output multipexor. Message data is input to the input registers, and corresponding parity data is generated by the parity encoder. The message data and the parity data are output from the data output multiplexor.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION OF THE INVENTION

Figure 1:
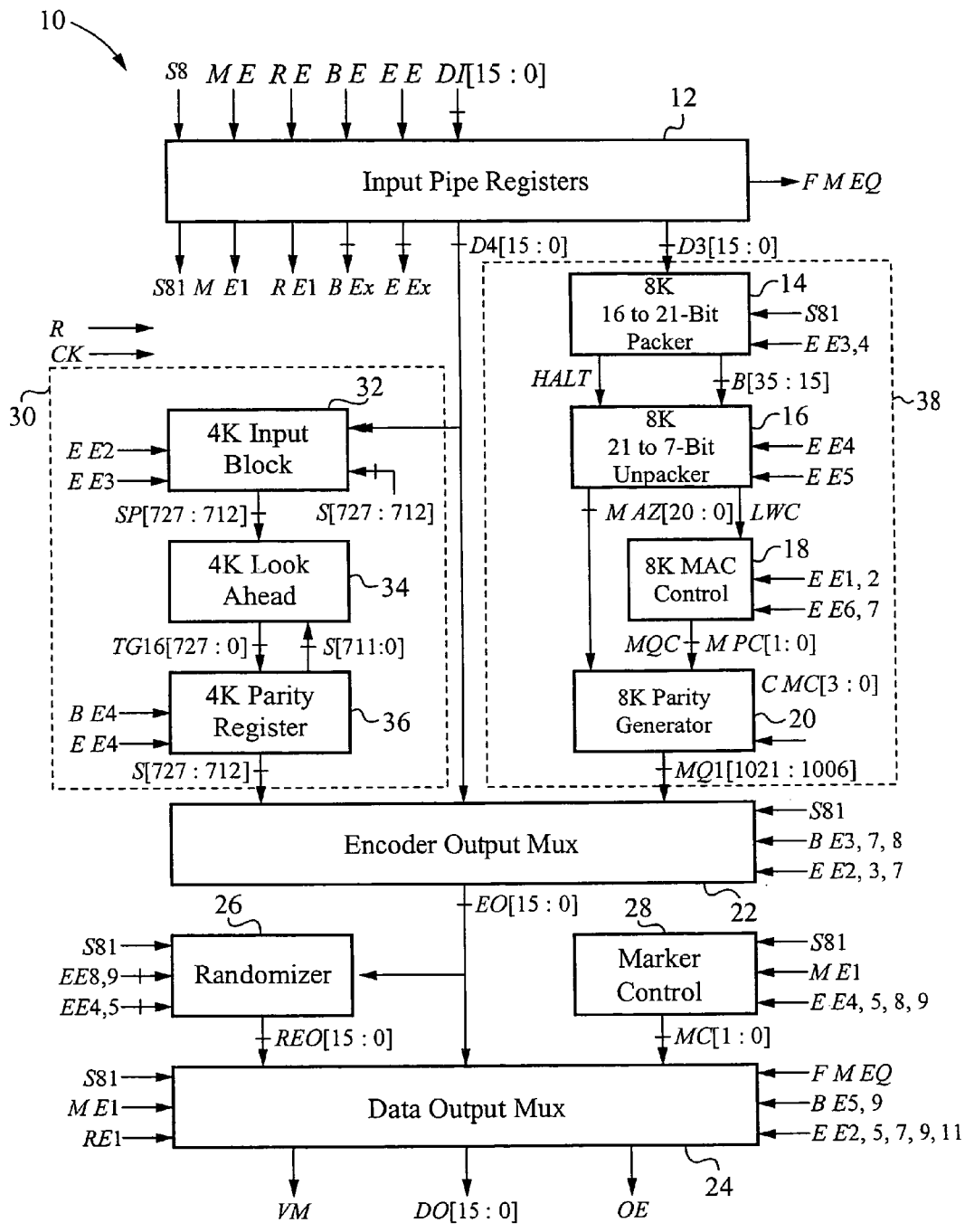
FIG. 1 illustrates a block diagram of an encoder of the present invention.

Embodiments of the present invention are directed to a radiation tolerant, encoding chip that implements two low-density parity-check (LDPC) codes. The first LDPC code is a (4088,3360) code (4K) which is shortened from a (4095, 3367) cyclic code. The second LDPC code is a quasi-cyclic (8158,7136) code (8K). An encoder chip utilizing the present invention can be programmed with other LDPC codes. Also included on the chip is a CCSDS (Consultative Committee for Space Data Systems) standard randomizer as well as a CCSDS standard attached synchronization marker (ASM) section. The architecture for a parity generator and the derivation of the sub-code which enables this architecture is described in detail below.

Code Description

The (8158,7136) code is shortened from a geometry-based (8176,7154) quasi-cyclic code designed to have an error floor no higher than $10^{-10}$ BER (bit error rate). The parent code is specified by a 1022×8176 H matrix containing 32 right circulant sub-matrices as follows:

$H = C_{1,1}\ C_{1,2}\ C_{1,3}\ \ldots\ C_{1,14}\ C_{1,15}\ C_{1,16}$
$\quad\ \ C_{2,1}\ C_{2,2}\ C_{2,3}\ \ldots\ C_{2,14}\ C_{2,15}\ C_{2,16}$ Each $C_{i,j}$ matrix is a 511×511 right-circulant matrix containing two "ones" per row and two "ones" per column. In general, each matrix $C_{i,j}$ can be different, although one, some, or all of the them can be the same. The column positions of the "ones" for the first row of the sixteen $C_{1,j}$ right-circulant matrices of one implementation of the invention, are as follows:

| 0    | 176  | 523  | 750  | 1022 | 1374 | 1557 | 1964 |
|------|------|------|------|------|------|------|------|
| 2044 | 2436 | 2706 | 2964 | 3066 | 3417 | 3586 | 3936 |
| 4088 | 4395 | 4652 | 4928 | 5110 | 5317 | 5639 | 5902 |
| 6132 | 6531 | 6845 | 7100 | 7154 | 7401 | 7701 | 7926 |

The column positions within each first row of matrix $C_{1,1}$ are numbered as (0, 1, 2, ..., 509, 510), the column positions within each first row of matrix $C_{1,2}$ are numbered as (511, 512, ..., 1020, 1021), and so on for each matrix $C_{ij}$. As such, the columns s for each "one" correspond to the numbered column positions. For example, the first row in matrix $C_{1,1}$ includes "ones" in column positions 0 and 176, and the first row of matrix $C_{1,2}$ includes "ones" in column positions 523 and 750. Since each matrix $C_{1,j}$ is a right-circulant matrix, the second and subsequent rows follow accordingly from the first rows of each $C_{1,j}$ matrix shown above.

The column positions of the ones for the first row of the sixteen $C_{2,j}$ right-circulant matrices are as follows:

| 99   | 471  | 641  | 984  | 1220 | 1457 | 1793 | 2011 |
|------|------|------|------|------|------|------|------|
| 2259 | 2464 | 2837 | 3036 | 3114 | 3462 | 3770 | 4022 |
| 4361 | 4518 | 4901 | 5050 | 5206 | 5489 | 5812 | 6007 |
| 6376 | 6599 | 7007 | 7113 | 7205 | 7536 | 7857 | 8079 |

Since each matrix $C_{2,j}$ is a right-circulant matrix, the second and subsequent rows follow accordingly from the first row of each $C_{2,j}$ matrix shown above.

Section A. Sub-Code Derivation

The sub-code (8158,7136) can be derived based on the observation that the (8176,7154) code contains two degenerate rows in the H matrix. A degenerate row is a linear sum of at least one other row. The generator matrix G is formed by manipulating the H matrix according to the following 4-step algorithm:

Step 1: Set up an initial H' by column positionswapping within the H matrix. Specifically, each column within the H matrix is right-shifted two columns as follows:

$H' = C_{1,15}\ C_{1,16}\ C_{1,1}\ \ldots\ C_{1,13}\ C_{1,14}$
$\quad\ \ C_{2,15}\ C_{2,16}\ C_{2,1}\ \ldots\ C_{2,13}\ C_{2,14}$ Step 2: Force the H' matrix from step 1 into upper triangular form.

```
for each row i of H' (i=1 to 1022)
    if H'_{i,i} equals 0
        find row where H'_{j,i} equals 1 (j=i+1 to 1022)
        if row found
            row i+rowj→row i
        else
            This row is degenerate
            H'_{i,j}=0 for j=1 to 1022
            H'_{i,j}=1 for j=1023 to 8176
            go to next row
        end if
        for each row j of H' (j=i+1 to 1022)
            if (H'_{j,i} equals 1)
                row i+row j→row j
        endfor
    endfor
```

Step 3: Make row 1022 circular.

Since row 1022 is degenerate, pick values for row 1022 such that row 1021 is a circulant shift of row 1022. This is done following the circular subroutine shown in section B below.

Step 4. Solve for H'=[I:P'] form.
   foreach row i of H' (i=1021 to 1)
     if i equals 511
       make row 511 circular
     foreach row j (j=i−1 downto 1)
       if $H'_{j,i}$ equals 1)
         row i+row j→row j
     endfor
   endfor The generator matrix G is then G=[I:P] where $P=P'^T$, and P consists of twenty-eight 511×511 right-circulant matrices such that:

$$G = \begin{bmatrix} I & 0 & \cdots & 0 & 0 & P_{1,0} & P_{1,1} \\ 0 & I & \cdots & 0 & 0 & P_{2,0} & P_{2,1} \\ \vdots & \vdots & \vdots & \vdots & \vdots & \vdots & \vdots \\ 0 & 0 & \cdots & I & 0 & P_{13,0} & P_{13,1} \\ 0 & 0 & \cdots & 0 & I & P_{14,0} & P_{14,1} \end{bmatrix}$$

Section B. Circular Subroutine

In general, let J be an arbitrary 511×511 matrix. Row 511 of each of the 511×511 matrices is degenerate and the matrix can be made circular by applying the following algorithm:

$$J = \begin{bmatrix} J_{1,1} & J_{1,2} & \cdots & J_{1,510} & J_{1,511} \\ J_{2,1} & J_{2,2} & \cdots & J_{2,510} & J_{2,511} \\ \vdots & \vdots & \vdots & \vdots & \vdots \\ J_{510,1} & J_{510,2} & \cdots & J_{510,510} & J_{510,511} \\ J_{511,1} & J_{511,2} & \cdots & J_{511,510} & J_{511,511} \end{bmatrix}$$

The values for $J_{5,I}$ are calculated according to the following recursion:
$J_{511,1}=0$
foreach i (i=2 to 511)
   $J_{511,i}=J_{511,i-1}+J_{510,i-1}$
endfor Encoder Architecture A block diagram of an encoder of the present invention is shown in FIG. 1. The encoder 10 includes an input pipe register 12, a parity encoder 30, a parity encoder 38, an encoder output MUX 22, a data output MUX 24, a randomizer 26, and a marker control 28. The parity encoder 30 is a 4 k parity encoder and includes a 4 k input block 32, a 4 k look ahead 34, and a 4 k parity register 36. The parity encoder 38 includes a bit packer 14, a bit unpacker 16, a multiply-accumulate (MAC) control 18, and a parity generator 20. The parity encoder 38 is a 8 k parity encoder. The bit packer 14 is a 8 k 16-bit to 21-bit packer. The bit unpacker 16 is a 8 k 21-bit to 7-bit unpacker. The MAC control 18 is a 8 k MAC control. The parity generator 20 is a 8 k parity generator.

Message data is input 16-bits at a time to the input pipe registers 12 via the data input bus (DI). Data to be encoded is framed by the encode enable (EE) signal. The (8158,7136) code is one of two codes on the encoder 10 and is selected by holding the select 8K (S8) input high. The message data and parity output by the encoder 10 is randomized if randomize enable (RE) is asserted. An optional internal frame marker precedes the message data if the marker enable (ME) is asserted. Data passes through the encoder 10 without being encoded using a bypass mode if bypass enable (BE) is asserted. Message data output on the data output bus (DO) is framed by output enable (OE). Valid marker (VM) flags, if correct, an external frame marker added during a bypass operation.

During operation of the encoder, a 1 Gb/s bit rate was achieved using a 64 MHz system clock. Alternatively, a 2 Gb/s bit rate was achieved using a 128 MHz system clock. When no frame marker is inserted, 446 sixteen-bit data words are input to the encoder and passed out of the encoder with nine clock cycles of latency. When the two-word frame marker is prepended, data has an eleven clock cycle latency. 64 sixteen-bit words follow, of which, 63 are parity bits. The final 16-bit output word contains the last 14 bits of parity with 0's appended.

Incoming message data is input to the encoder 10 16-bits at a time. A set of twenty eight 511×511 circulant sub-matrices multiply the incoming data according to c=uG where u is a block of 7136-bits of incoming message data prepended with 18 zeros. To minimize the size of the multiply-accumulate block (MAC) necessary to perform this calculation, partial product multiplication is used. Since 511=7×73, data is packed by the bit packer 14 into a word which is an integer multiple of 7. To avoid buffering any significant portion of the incoming data, the packed word must be greater than 16-bits, the number of bits input into the encoder 10 at a time. Choosing the packed word length to be 21 minimizes the size of the multiply-accumulate block. The bit packer 14 includes a state machine and a packing register. The state machine has 22 states. The packing register is a 36-bit packing register. The state machine controls the packing of the data into the packing register according to Table I below.

TABLE 1

| Present State | Next State | Stored Data | Data In | Data Out | Excess Data | MAC Halt |
|---|---|---|---|---|---|---|
| 00 | 01 | 18 + | 16 − | 21 = | 13 | |
| 01 | 02 | 13 + | 16 − | 21 = | 8 | |
| 02 | 03 | 8 + | 16 − | 21 = | 3 | |
| 03 | 04 | 3 + | 16 − | = | 19 | HALT |
| 04 | 05 | 19 + | 16 − | 21 = | 14 | |
| 05 | 06 | 14 + | 16 − | 21 = | 9 | |
| 06 | 07 | 9 + | 16 − | 21 = | 4 | |
| 07 | 08 | 4 + | 16 − | = | 20 | HALT |
| 08 | 09 | 20 + | 16 − | 21 = | 15 | |
| 09 | 0A | 15 + | 16 − | 21 = | 10 | |
| 0A | 0B | 10 + | 16 − | 21 = | 5 | |
| 0B | 0C | 5 + | 16 − | 21 = | 0 | |
| 0C | 0D | 0 + | 16 − | = | 16 | HALT |
| 0D | 0E | 16 + | 16 − | 21 = | 11 | |
| 0F | 0F | 11 + | 16 − | 21 = | 6 | |
| 0F | 10 | 6 + | 16 − | 21 = | 1 | |
| 10 | 11 | 1 + | 16 − | = | 17 | HALT |
| 11 | 12 | 17 + | 16 − | 21 = | 12 | |
| 12 | 13 | 12 + | 16 − | 21 = | 7 | |
| 13 | 14 | 7 + | 16 − | 21 = | 2 | |
| 14 | 15 | 2 + | 16 − | = | 18 | HALT |
| 15 | 01 | 18 + | 16 − | 21 = | 13 | |

Since the LDPC code used by the parity encoder 38 is shortened from an (8176,7154) code to an (8158,7136) code, the 18 prepended zero's are added in the initialization state (shown as present state 00 in Table 1). The remaining 21-states of the bit packer 14 are then cycled through thereby packing the input message data. Whenever less than 21 bits are available in the packing register, the downstream processing is halted for a clock cycle, as indicated by 'HALT' in Table 1.

Figure 2:
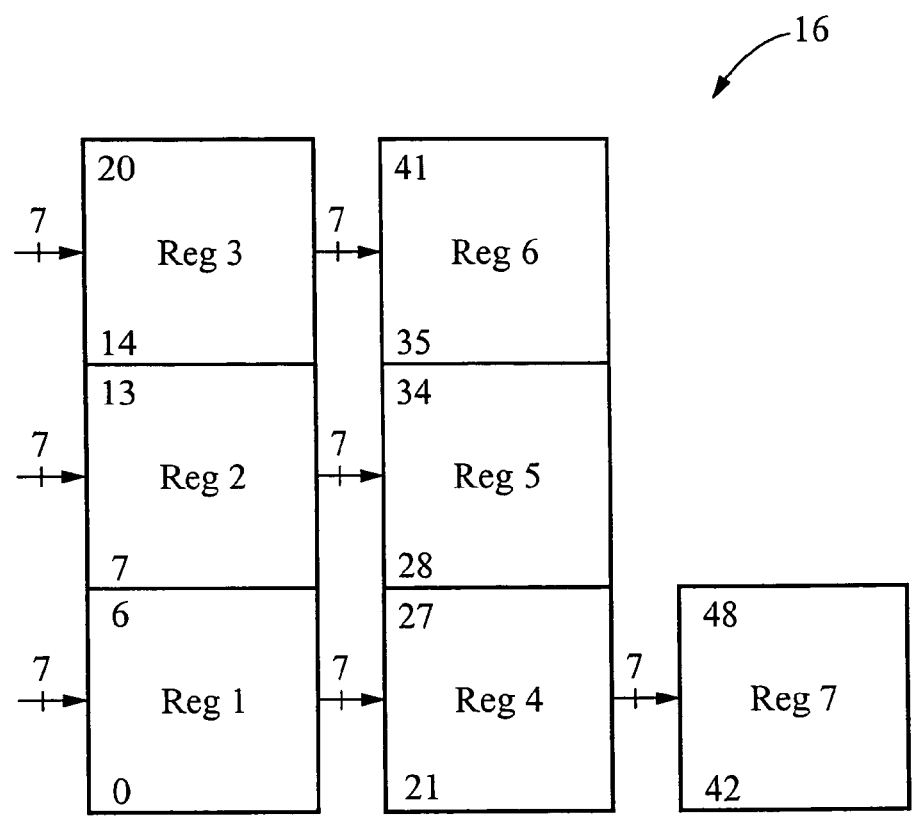
FIG. 2 illustrates a data flow register included within the bit unpacker.

The 21-bit packed data is sent from the bit packer 14 to the bit unpacker 16. Since 511=24×21+7, the 21-bit data must first be adjusted to a 7-bit format at the boundary between circulant matrices before the data is sent to the MAC control 18. The bit unpacker 16 includes a 49-bit data flow register, which is illustrated in FIG. 2. The 49-bit data flow register is used to adjust the data flow across the boundaries at each 511$^{th}$ bit. The bit unpacker 16 also includes a five-state sequencer (LC[2:0]) that controls the source of data from the 49-bit data flow register to supply an input (MNZ[20:0] in FIG. 1)) to a MAC module (MAC 206 and MAC 208 in FIGS. 3 and 4) in the parity generator 20, according to Table 2.

TABLE 2

| | LC = 0 | LC = 2 | LC = 4 → 1 | LC = 3 → 0 |
|---|---|---|---|---|
| MAZ [20:14] | Register 3 | Register 5 | Register 7 → 4 | Register 6 → 3 |
| MAZ [13:7] | Register 2 | Register 4 | Register 6 → 3 | Register 5 → 2 |
| MAZ [6:0] | Register 1 | Register 3 | Register 5 → 2 | Register 4 → 1 |

The bit unpacker 16 also includes a word counter (WC[4:0]) that counts the 21-bit words and flags the last word (LWC) which contains the final 7 bits of data in the first 511-bit block, the final 14 bits in the second block and the final 21 bits in the third block. The five-state sequencer (LC[2:0]) rotates through the 5 states for every three of the 511-bit blocks of data, also adjusting for halts required by the bit packer 14. The five-state sequencer is reset after the fourteenth 511-bit block of data is processed. In general, the configuration of the bit packer 14 and the bit unpacker 16 is a function of the structure of the H matrix. In the implementation described above where the H matrix comprises 511×511 matrices, the bit packer is configured as a 16-bit to 21-bit packer and the bit unpacker is configured as a 21-bit to 7-bit unpacker. In alternative implementations in which the H matrix is structured differently, the bit packer and the bit unpacker are configured according to the structure of the H matrix. In certain structures of the H matrix, for example an H matrix comprising 512×512 matrices, a bit packer and a bit unpacker are not needed, as in the case of the 512×512 matrix, 512 is divided evenly by 16-bits.

Figure 3:
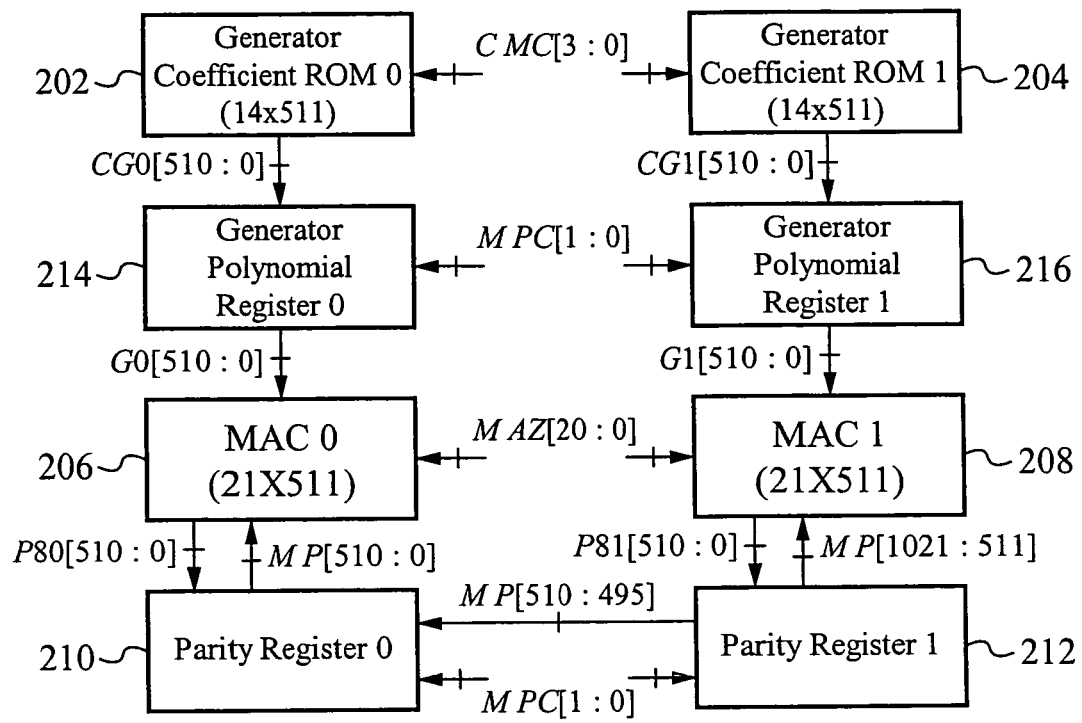
FIG. 3 illustrates a first embodiment of the parity generator from the encoder of FIG. 1.
Figure 4:
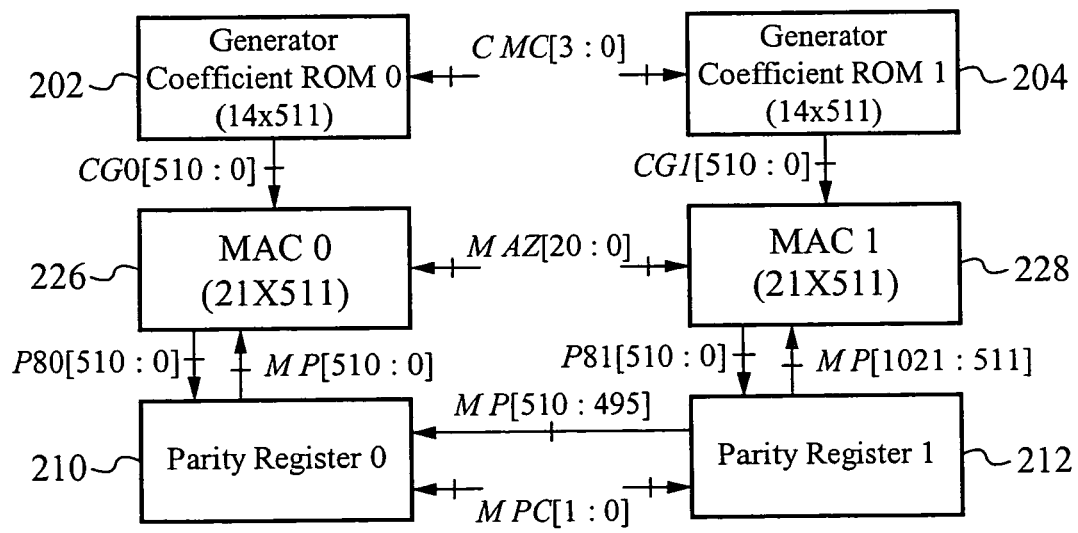
FIG. 4 illustrates a second embodiment of the parity generator from the encoder of FIG. 1.

A first embodiment of the parity generator 20 (FIG. 1) is illustrated in FIG. 3. The parity generator is configured into two blocks, each block including a generator polynomial register 214, 216, a multiply-accumulate arithmetic unit (MAC) 206, 208, and a parity register 210, 212. To reconstruct the generator polynomial, only the coefficients for the first rows of the right-circulant matrices need to be known. These coefficients are stored in two 14×511 generator coefficient ROMs 202, 204, which are implemented utilizing sub-function encoding. The generator coefficient ROMs 202, 204 are mux-based ROMs. A 4-bit circulant matrix counter (CMC [3:0]) maintains a count of which 511-bit block of message data is present and provides the ROM address within the generator coefficient ROMs 202, 204 to select the appropriate initial row coefficients. The 28 generator polynomials are then, in turn, generated by right-shifting the initial coefficients in the polynomial generator register 214, 216. Such a function requires 1,022 flip flops to generate and store the two generator polynomials. By observing that the same mathematics can result from simply left-shifting the parity register 210, 212 before applying the next 21 bits of data to the MAC module 206, 208, the two 511-bit generator polynomial registers 214, 216 can be eliminated, as shown in FIG. 4. FIG. 4 shows a second embodiment of the parity generator 20.

A general multiply-accumulate block (MAC) 226, 228 is used rather than a dedicated look-ahead block to allow arbitrary generator polynomials to be programmed by the coefficient ROM. The MAC 226, 228 operates on the message data n=21 bits at a time. A straight forward design of the MAC 226, 228 results in a linear delay path of n+1=22 levels. Since propagation through the MAC 226, 228 is a critical timing path for the encoder 10, the logic is transformed into a tree form with a logic depth given by the next integer greater than $\log_2(n)+1$. Using this tree form of logic, the delay path is reduced to 6 levels of logic, greatly improving the speed of the encoder 10.

The parity registers 210, 212 are controlled according to Table 3 below.

TABLE 3

| LWC MPC [1:0] | Parity Register 210 | Parity Register 212 |
|---|---|---|
| 000 | Hold | Hold |
| 001 | Load 21 bits left shift | Load 21 bits left shift |
| 010 | Load 0's | Load 0's |
| 011 | Shift 16, drag 0's | Shift 16, drag MP [510:495] |
| 1xx | Load 7 bit left shifted P80 | Load 7 bit left shifted P81 |

Five basic functions are performed by the parity register 210, 212. First, the contents are held during halt states. This corresponds to state 000 in Table 3. Second, the results of the MAC operation in MAC 206, 208 are loaded while simultaneously shifting 21 bits to the left during the first 24×21=504 bits of each 511-bit block. This corresponds to state 001 in Table 3 and allows elimination of a register for storing the next row of the G matrix. Third, the results of the MAC operation in MAC 206, 208 are loaded while simultaneously shifting 7-bits left at the boundary between 511-bit blocks of the message data. This corresponds to state 1xx in Table 3. Fourth, the parity register is reset when data is not being encoded. This corresponds to state 010 in Table 3. Fifth, since no new message data is input to the encoder 10 for at least (1022+2)/16=64 clock cycles to allow the parity bits to be shifted out, most of the parity register 210, 212 can also be used as the output shift register. A shadow register for only the most significant 80 bits is needed in the output path to allow calculations on the parity for the next code word to begin while the final five 16-bit words of parity for the previous message are shifted out. This eliminates the need for a separate 1,022-bit output register. This corresponds to state 011 in Table 3.

The reduction of and functional sharing of flip flops within the encoder of the present invention results in improved efficiency. Compared with other conventional encoding schemes for quasi-cyclic LDPC codes, in particular a shift-register-adder-accumulator (SRAA) encoding scheme and a two-stage encoder encoding scheme described by Li et al. in "Efficient Encoding of Quasi-Cyclic LDPC Codes", the encoder of the present invention uses significantly fewer flip flops, less than 5.2% of the flip flops required by the SRAA architecture and less than 18.3% of the flip flops required by the two-stage encoder of Li et al., to achieve similar throughput. When comparing the encoder of the present invention to encoding schemes with similar numbers of flip flops, the encoder for the present invention achieves significantly faster data rates. Table 4 below shows a comparison the clock-cycles and flip flop count between the encoder of the present invention and the SRAA architecture and the two-stage encoder of Li et al.

TABLE 4

| Architecture | clock-cycles | flip flop count |
|---|---|---|
| Conventional Two-Stage | 1,533 | 7,665 |
| (Li et al.) | 511 | 8,176 |
| Conventional SRAA | 7,154 | 2,044 |
| | 511 | 28,616 |
| Present Encoder | 511 | 1,492 |

Before proper circuit operation can begin, the encoder 10 is initialized by bringing the reset input (R) high for at least two clock pulses. At this time, it is also necessary to bring the encoder enable (EE) inactive low to ensure no spurious messages are processed. The marker enable input (ME) is either brought high to enable the frame marker or brought low to disable the frame marker. Since the encoder 10 includes two encoders, the S8 input is held high to enable the parity encoder 38, and the S8 input is held low to enable the parity encoder 30. The marker enable input (ME) and the input S8 remain in the selected states until another initialization occurs. Once initialization is completed, the reset input (R) is brought low.

Two clock pulses after the reset input (R) is brought low, circuit operation commences. The encoder 10 can be re-initialized at any time, but any messages being processed by the encoder 10 at that time are lost. Zeros are clocked into the parity generator whenever the encoder enable (EE) input is low.

Encoding is performed by operating on message data presented to the encoder 10 16-bits at a time on the data input bus (DI). The first bit of the message data is presented on the most significant bit of the data input bus (DI) with the first data word. Encoder enable (EE) input is brought high coincidentally with the first word of message data to be encoded. Encoder enable (EE) input remains high until the 446 words of message data have been clocked into the encoder 10 on the data input bus (DI). If marker enable input (ME)=0, then the input message data appears on the output data bus (DO) nine clock cycles after being presented on the input data bus (DI). If marker enable input (ME)=1, then the input message data follows the prepended frame marker and appears on the output data bus (DO) eleven clock cycles after being presented on the input data bus (DI). Data is clocked in and out of the encoder 10 on the rising edge of the clock input (CK).

Encoder enable input (EE) is brought low when the last message data has been clocked into the input registers 12. If ME=0, then encoder enable input (EE) remains low for at least 64 clock cycles. If ME=1, then marker enable input encoder enable input (EE) remains low for at least 66 clock cycles. While the encoder enable input (EE) remains low, 64 sixteen-bit words are clocked into the input register 12, of which 63 are parity bits. The last 14 bits of parity are DO[15:2] of the 64' parity word. DO[0:1] of the last parity word are zeros. If marker enable input (ME)=1, holding encoder enable input (EE) low for at least 66 clock cycles allows room for the frame marker to precede the following block of message data.

The preceding operation also fills the parity generator 20 with zeros. If encoder enable input (EE) is held low longer than 64/66 clock cycles, then zeros will appear on the data output bus (DO). Bringing encoder enable input (EE) high after it has been held low for 64/66 or more clock cycles starts the processing of the nest set of message data.

After a reset operation, or after a message data block has been encoded, and the parity read from the encoder 10, and if marker enable input (ME)=0, a data bypass operation can occur. Message data can flow through the encoder 10 without being encoded by bringing bypass enable input (BE) high coincidentally with the first word of message data to be passed unprocessed through the encoder 10. After the nine clock cycles of latency, the message data entering on input data bus (DI) appears on output data bus (DO) and continues to pass through the chip as long as bypass enable input (BE) remains high. While bypass enable input (BE) is high, encoder enable input (EE) must be held low to hold the parity registers 210, 212 in the parity generator 20 reset. A bypass operation can be used to insert an externally generated frame marker, which is described in greater detail below.

The randomizer 26 includes a sequence generator that utilizes a pseudo-random sequence generated by $h(x)=x^8+x^7+x^5+x^3+1$. If randomizer input enable (RE)=1, then this sequence is applied to the message data and parity data before being output the output data bus (DO). The 255-bit sequence is bitwise exclusive ORed with the code word. The sequence generator is initialized to all "ones" at the beginning of each code word. The frame marker is not affected by the randomizer 26 regardless of the state of randomizer enable input (RE). If randomizer enable input (RE)=1, then zeros appearing on the output data bus (DO) between code words are randomized. The sequence generator begins operation on the first bit of message data in the codeword. If randomizer enable input (RE)=1 and the bypass mode is also enabled (bypass enable input (BE)=1), then the message data that is bypassed is processed through the randomizer 26. An unrandomized frame marker can be included in the randomized bypassed message data by bringing randomizer enable input (RE) low coincident with the first word of unrandomized frame marker and bringing randomizer enable input (RE) high after the last word of frame marker.

If marker enable input (ME)=1, then the marker control 28 generates a 32-bit frame marker that is output in two 16-bit words. This frame marker functions as the attached synchronization marker for non-turbo-coded data specified in the CCSDS standard as the following hex sequence: 1ACF FCID. This frame marker is output in the two clock cycles preceding the first word of message data in a code block.

An externally generated frame marker can be introduced with a bypass operation. Whenever a bypass operation immediately precedes an encoding operation, if the last two 16-bit words of bypassed data are 1ACF followed by FCID, then the valid marker output (VM) output will be a 1 as these two words are output on input data bus (DO).

The latency of message data through the encoder 10 is nine clock cycles if marker enable input (ME)=0 and eleven clock cycles if marker enable input (ME)=1. Thus, nine/eleven clock cycles after encoder enable input (EE) is brought high, the output enable (OE) goes high specifying the start of message data in a valid code word. When output enable (OE) goes low, the encoder 10 is outputting the parity bits. Thus, output enable (OE) functions to frame the message data and is only high when message data is being output.

The various combinations of high/low enablement bits, clock cycles, and data flow between the various components related to particular functions of the encoder are described above for exemplary purposes only. It is contemplated that other combinations can be used to achieve the same, or additional functions, of the encoder of the present invention.

Radiation Tolerant (RT) chip operation is achieved through the application of Radiation Hardness By Design (RHBD) techniques. These include Single Event Upset (SEU) immune flip flop designs utilizing data storage redundancy with conflict-free fault detection and correction capability internal to each memory cell. To enable the 'single event' assumption in design of these cells, nodes in the flip flop cells, which if simultaneously upset would latch the effect of the upset, are separated by large enough spacings to avoid this potential problem. The separation between cells is also increased to insure that the minimum spacing required to avoid simultaneous upset is maintained between cells and rows.

Elimination of the capture of Single Event Transients (SETs) occurring in the combinational logic that may arrive at a flip flop input coincident with the storage triggering clock edge is achieved through the combination of an RT design characteristic providing redundant fault tolerant inputs to the flip flop and a delay element connected between the combinational logic and one of the redundant inputs. With this design, a SET dissipates at the non-delayed input before it arrives at the delayed input, thus insuring that the transient is not presented to both redundant fault tolerant inputs simultaneously and the effect of the transient is not stored.

The RT library cells are drawn with continuous guard bars through the middle of the cells. Filler cells and end cap cells are used to insure a continuous guard ring around and through the rows of cells. This guard ring eliminates Single Event Latch-up (SEL).

Embodiments of the encoder are described above in terms of 511×511 right-circulant matrices. Alternatively, circulant matrices of size 512×512 can be used, which eliminates the packer and unpacker and allows the MAC to operate as a power of two, which would allow a smaller circuit and faster processing speed. Still alternatively, instead of the encoder implementing an 8K LDPC code, a 16K LDPC code can be used by making the circulant matrices powers of two.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A method of encoding data, the method comprising:
   a. defining an H matrix, wherein the H matrix comprises a plurality of sub-matrices configured as rows and columns, each sub-matrix comprising a circulant matrix, and wherein the H matrix is defined according to a (8158,7136) low-density parity check code;
   b. shifting each column of the H matrix by two columns to the right, thereby forming an H' matrix;
   c. forcing the H' matrix into upper triangular form;
   d. making a last row of the upper triangular form H' matrix circular, thereby forming an H" matrix;
   e. determining a parity matrix P according to $P=P'^T$, wherein $P'^T$ is determined according to H"=[I:P'];
   f. generating a generator matrix G according to G=[I:P]; and
   g. encoding the data according to the generator matrix G.

2. The method according to claim 1 wherein the last row of the upper triangular form H' matrix comprises row 1022.

3. The method according to claim 1 wherein each circulant matrix within the H matrix comprises a right-circulant matrix.

4. The method according to claim 1 wherein the H matrix comprises 32 right-circulant matrices.

5. The method according to claim 1 wherein each circulant matrix within the H matrix comprises a 511×511 right-circulant matrix.

6. The method according to claim 5 wherein each 511×511 right-circulant matrix includes two ones per row and two ones per column.

7. The method according to claim 1 wherein the H matrix comprises a 2×16 array of right-circulant matrices.

8. The method according to claim 1 wherein the (8158, 7136) low-density parity check code is shortened from a (8176,7154) quasi-cyclic low-density parity check code.

9. The method according to claim 1 wherein each circulant matrix comprises a 512×512 right-circulant matrix.

10. The method according to claim 9 wherein each 512×512 right-circulant matrix includes one per row and one per column.

11. The method according to claim 9 wherein the H matrix is configured as a 4×32 array of the 512×512 right-circulant matrices.

12. The method according to claim 1 wherein each circulant matrix is configured differently.

13. An encoder to provide parity data, the encoder comprising:
   a. an input register to receive input data;
   b. a parity generator coupled to receive the input data from the input register, wherein the parity generator generates parity data according to a G matrix, further wherein the parity generator generates the G matrix by defining an H matrix, wherein the H matrix comprises a plurality of sub-matrices configured as rows and columns and the H matrix is defined according to a (8158,7136) low-density parity check code, each sub-matrix comprising a circulant matrix, shifting each column of the H matrix by two columns to the right, thereby forming an H' matrix, forcing the H' matrix into upper triangular form, making a last row of the upper triangular form H' matrix circular, thereby forming an H" matrix, determining a parity matrix P according to $P=P'^T$, wherein $P'^T$ is determined according to H"=[I:P'], and generating the G matrix according to G=[I:P]; and
   c. an output circuit to output the input data received from the input register and the parity data received from the parity generator.

14. The encoder according to claim 13 wherein the output circuit comprises a multiplexor.

15. The encoder according to claim 13 further comprising a randomizer coupled to receive and to randomize the input data and the parity data.

16. The encoder according to claim 13 further comprising a bit packer coupled to receive the input data from the input register and to output a data packet.

17. The encoder according to claim 16 wherein the bit packer comprises a 16-bit to 21-bit packer and the data packet comprises a 21-bit data packet.

18. The encoder according to claim 16 further comprising a bit unpacker coupled to receive the data packet from the bit packer and to reformat the data packet at a boundary between two of the circulant matrices.

19. The encoder according to claim 18 wherein the bit unpacker comprises a 21-bit to 7-bit unpacker.

20. The encoder according to claim 13 wherein the parity generator comprises a generator coefficient read-only-memory, a multiply-accumulate block, and a parity register.

21. The encoder according to claim 20 wherein the parity generator further comprises a generator polynomial register.

22. The encoder according to claim 13 wherein the parity generator comprises an 8 k parity generator.

23. The encoder according to claim 13 wherein the parity generator comprises two independent parity generators.

24. The encoder according to claim 23 wherein the two parity generators comprise an 8 k parity generator and a 4 k parity generator.

25. The encoder according to claim 13 wherein the last row of the upper triangular form H' matrix comprises row 1022.

26. The encoder according to claim 13 wherein each circulant matrix within the H matrix comprises a right-circulant matrix.

27. The encoder according to claim 13 wherein the H matrix comprises 32 right-circulant matrices.

28. The encoder according to claim 13 wherein each circulant matrix within the H matrix comprises a 511×511 right-circulant matrix.

29. The encoder according to claim 28 wherein each 511×511 right-circulant matrix includes two ones per row and two ones per column.

30. The encoder according to claim 13 wherein the H matrix comprises a 2×16 array of right-circulant matrices.

31. The method according to claim 13 wherein the (8158, 7136) low-density parity check code is shortened from a (8176,7154) quasi-cyclic low-density parity check code.

32. The encoder according to claim 13 wherein each circulant matrix comprises a 512×512 right-circulant matrix.

33. The encoder according to claim 32 wherein each 512×512 right-circulant matrix includes one per row and one per column.

34. The encoder according to claim 32 wherein the H matrix is configured as a 4×32 array of the 512×512 right-circulant matrices.

35. The encoder according to claim 13 wherein each circulant matrix is configured differently.

36. A parity generator for generating parity data, the parity Comprising:
   a. a bit packer configured to receive a data stream as a series of n-bit words to package the n-bit words into m-bit words according to a multi-state machine, and to output a stream of the m-bit words, wherein each data block of the stream is defined by a data block boundary and includes a plurality of m-bit words;
   b. a bit unpacker configured to receive the stream of m-bit words from the bit packer the bit unpacker including a word counter configured to determine and flag an m-bit word corresponding to a data block boundary of a data block, the bit unpacker further configured to adjust a data flow rate of the flagged m-bit word corresponding to the data block boundary, wherein the flagged m-bit word is the last m-bit word in the block;
   c. a memory to store a first row of a generator matrix;
   d. a multiply-accumulate arithmetic unit to apply the first row of the generator matrix to a first message data thereby generating a first codeword of parity data;
   e. parity register to receive the first codeword of parity data from the multiply-accumulate arithmetic unit; and
   f. a shadow register to store a specified number of most significant bits from the first codeword of message data in the parity register, wherein the specified number of most significant bits in the shadow register enables the multiply-accumulate arithmetic unit to apply a second row of the generator matrix to the first message data to generate a second codeword of parity data while the first codeword of parity data to generate a second codeword of parity data while the first codeword of parity data is shifted out of the parity register.

37. The parity generator of claim 36 wherein the multiply-accumulate arithmetic unit is programmable.

38. An encoder to provide parity data, he encoder comprising:
   a. an input register to receive input data;
   b. a parity generator coupled to receive the input data from the input register, wherein the parity generator generates parity data according to a G matrix, further wherein the parity generator generates the G matrix by defining an H matrix, wherein the H matrix comprises a plurality of sub-matrices configured as rows and columns and the H matrix is defined according to a (8158, 7136) low-density parity check code, each sub-matrix comprising a circulant matrix, shifting each column of the H matrix by two columns to the right, thereby forming an H' matrix, forcing the H' matrix into upper triangular form, making a last row of the upper triangular form H' matrix circular, thereby forming an H" matrix, determining a parity matrix P according to P=P'^T, wherein P'^T is determined according to H"=[I:P'], and generating the G matrix according to G=[I:P] and
   c. an output circuit to output the input data received from the input register and the parity data received from the parity generator.

* * * * *